(12) United States Patent
Hayashi et al.

(10) Patent No.: US 8,216,922 B2
(45) Date of Patent: Jul. 10, 2012

(54) PLASMA DOPING METHOD

(75) Inventors: Shigenori Hayashi, Nara (JP);
Masafumi Kubota, Osaka (JP);
Yuichiro Sasaki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/051,436

(22) Filed: Mar. 18, 2011

(65) Prior Publication Data

US 2011/0230038 A1    Sep. 22, 2011

(30) Foreign Application Priority Data

Mar. 19, 2010    (JP) .................................. 2010-063747

(51) Int. Cl.
*H01L 21/26* (2006.01)
*H01L 21/42* (2006.01)

(52) U.S. Cl. ......... 438/513; 257/E21.143; 257/E21.331; 257/E21.459; 438/730

(58) Field of Classification Search ........... 257/E21.143, 257/E21.331, E21.459; 438/513, 730
See application file for complete search history.

(56) References Cited

U.S. PATENT DOCUMENTS

| 4,937,205 | A | * | 6/1990 | Nakayama et al. ........... 438/513 |
|---|---|---|---|---|
| 2005/0170669 | A1 | | 8/2005 | Okumura et al. |
| 2005/0287776 | A1 | | 12/2005 | Sasaki et al. |
| 2006/0121704 | A1 | | 6/2006 | Walther et al. |
| 2007/0020958 | A1 | | 1/2007 | Okumura et al. |
| 2008/0044960 | A1 | * | 2/2008 | Al-Bayati et al. ........... 438/156 |

FOREIGN PATENT DOCUMENTS

| JP | 11-026433 | 1/1999 |
|---|---|---|
| JP | 11-219938 | 8/1999 |
| JP | 11-224796 | 8/1999 |
| JP | 11-329271 | 11/1999 |
| JP | 2001-358129 | 12/2001 |
| JP | 2003-209057 | 7/2003 |
| JP | 2004-179592 | 6/2004 |
| JP | 3559429 | 9/2004 |
| JP | 2008-523625 | 7/2008 |
| JP | 4303662 | 7/2009 |

* cited by examiner

*Primary Examiner* — Asok Sarkar
(74) *Attorney, Agent, or Firm* — McDermott Will & Emery LLP (57) ABSTRACT

Plasma doping is performed using a plasma made of a gas containing an impurity which will serve as a dopant. In this case, at least one of plasma generation high-frequency power and biasing high-frequency power is supplied in the form of pulses.

20 Claims, 7 Drawing Sheets

PLASMA DOPING METHOD

CROSS-REFERENCE TO RELATED APPLICATION

This application claims priority to Japanese Patent Application No. 2010-063747 filed on Mar. 19, 2010, the disclosure of which including the specification, the drawings, and the claims is hereby incorporated by reference in its entirety.

BACKGROUND

The present disclosure relates to plasma processing methods using high-frequency electric discharge, and more particularly, to methods of plasma doping of a solid surface portion etc. with an impurity.

In recent years, as the integration density, performance, and speed of semiconductor integrated circuit devices have been increased, there has been a demand for a technique for lower-energy, higher-density and more conformal doping in order to achieve shallower junction and three-dimensional structure for transistor scaling. To achieve this, plasma doping has been studied as an alternative to conventional ion implantation.

In general, plasma doping can supply high current using low energy compared to ion implantation. The doping characteristics of plasma doping, however, depend significantly on conditions for a plasma, and therefore, plasma doping has a problem with injection efficiency, uniformity, controllability, etc. Therefore, various plasma generation techniques have been studied, and various modifications have been made to each plasma generation technique. For example, Japanese Translation of PCT International Application No. 2008-523625 describes a modified version of DC pulsed discharge. Japanese Patent Publication H11-329271 describes a modified version of high-frequency discharge. In these modified versions of the plasma generation techniques mainly try to improve the efficiency of ionization of a dopant species to be supplied. However, when the dopant is mainly supplied in the form of ions, there is unavoidably a problem with uniformity, stability, etc. which are limited by the plasma conditions as described above. In particular, instability during plasma ignition is unavoidable, directly leading to variations in the degree of doping. The directivity of ions as a dopant species, in principle, makes it nearly impossible to dope a side surface of a three-dimensional structure, such as a semiconductor region in the shape of a fin (hereinafter referred to as a fin-shaped semiconductor region) shown in FIG. 8.

Figure 8:
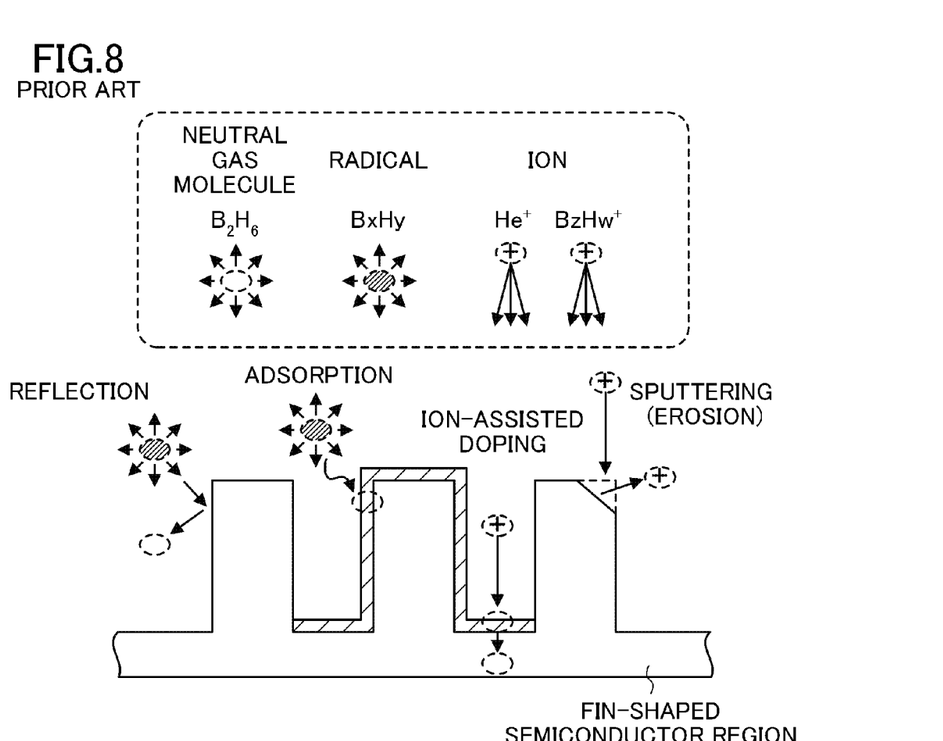
FIG. 8 is a diagram schematically showing plasma doping performed in a fin-shaped semiconductor region.

In contrast to this, Japanese Patent Publication No. 2004-179592 describes a doping technique which provides good uniformity and time controllability by using a plasma containing a doping gas (e.g., $B_2H_6$) diluted to the extent possible with a noble gas (e.g., He). In the plasma doping technique of Japanese Patent Publication No. 2004-179592, the dilution ratio of the doping gas is set to be considerably low (less than 0.05%). It is presumed that most ions contained in the plasma are noble gas ions ($He^+$ etc.), and the dopant species is supplied in the form of a neutral radical mainly containing boron (B) etc. to a surface of a material to be doped, although the underlying mechanism has not been elucidated. As shown in FIG. 8, unlike ions, the neutral radical does not have directivity, i.e., has isotropy. Therefore, in principle, the dopant can be supplied and attached to a three-dimensional structure uniformly (conformally), i.e., to vertical (side) surfaces as well as horizontal (top or bottom) surfaces.

SUMMARY

In the plasma doping technique of Japanese Patent Publication No. 2004-179592, however, for example, when an attempt is made to increase the amount of a dopant supplied to a material to be doped, the following problems arise: a resist material is hardened and therefore becomes difficult to remove; and the material to be doped is etched (sputtering), resulting in erosion.

The present disclosure describes implementations of a higher-concentration and more conformal plasma doping technique which can be performed while reducing or preventing the erosion of a material to be doped and the hardening of a resist material.

The present inventors have studied the plasma doping technique of Japanese Patent Publication No. 2004-179592 in order to clarify the underlying mechanism etc. thereof. As a result, the present inventors have found that, in the plasma doping technique of Japanese Patent Publication No. 2004-179592, there are constraints on the preferred plasma conditions because of a presumed mechanism described below.

In the plasma doping technique of Japanese Patent Publication No. 2004-179592, as shown in FIG. 8, most dopants are radicals (e.g., $B_xH_y$ ($x \leq 1$ and $y \leq 5$) produced by a dopant gas (e.g., $B_2H_6$) being decomposed by electron impact dissociation in a plasma, and the radicals are conformally adsorbed by a surface (e.g., a fin-shaped semiconductor region) of a material to be doped. Moreover, while the radials are adsorbed in the surface of the material to be doped, ions of a dilution gas (e.g., He) collide with the adsorbed radicals, or the radicals are adsorbed by the surface of the material to be doped which is activated by collision of the dilution gas ions, whereby doping is carried out with higher efficiency.

Therefore, the plasma doping technique of Japanese Patent Publication No. 2004-179592 is considered to have a doping mechanism (ion-assisted doping) in which radicals play a primary role with the assistance of ion irradiation. In such ion-assisted doping, it is fundamentally critical to supply radicals and ions with high efficiency. Conditions preferred for such efficient supply has a process window as shown in FIG. 9.

Figure 9:
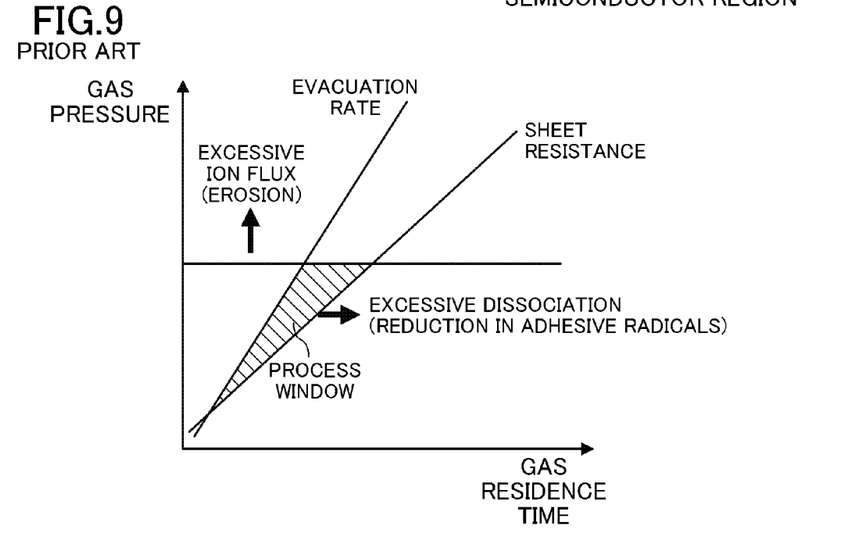
FIG. 9 is a diagram showing a process window in a conventional plasma doping method.

As shown in FIG. 9, (1) as a gas (total gas) pressure is increased, the degree of doping generally increases, but the rate of ion flux (the amount of ions supplied) also increases. If the ion flux rate is excessive, the sputtering effect is not negligible, and as a result, a phenomenon called "erosion" occurs in which a material to be doped is adversely etched. Therefore, it is necessary to reduce the ion flux rate in the ion-assisted doping to a predetermined level or lower, taking into consideration damage to the channel region of a transistor, and application to devices with a three-dimensional structure, such as a transistor formed in a fin-shaped semiconductor region (hereinafter referred to as a fin-shaped transistor) etc. In addition, as the ion flux rate increases, the resist material is adversely further hardened due to cross-linking of the resist material and is therefore more difficult to remove.

Moreover, as shown in FIG. 9, (2) as the gas flow rate is reduced while the total gas pressure is kept constant, the degree of doping decreases to such an extent that the resistance reduction effect is not sufficiently obtained. In this case, the decrease of the gas flow rate only leads to an increase in a gas residence time (=[chamber volume]×[gas pressure]/[gas flow rate]), and therefore, ions and electrons in the plasma are typically less affected. Therefore, the lack of the resistance reduction effect is considered to be caused by the radicals. Specifically, it is presumed that as the gas residence time increases, the dissociation reaction excessively proceeds to a proportionate extent, and as a result, low-molecular weight radicals which are more likely to be reflected by a surface of a material to be doped are produced, and therefore, the adhesion ratio of the dopant is reduced.

Thus, conditions preferred for the ion-assisted doping are selected so that the gas flow rate is increased and the gas residence time is decreased while the total gas pressure is kept lower than an upper limit below which erosion does not occur. The gas residence time which can actually be set has a lower limit because of the limit of the capacity accuracy of a mass flow controller which controls the gas flow rate, the limit of the apparatus evacuation speed, etc. In other words, the selection of the conditions for plasma doping using the ion-assisted doping technique is limited by a process window as shown in FIG. 9.

However, while shallower, denser, more uniform, and more conformal doping needs to be carried out in order to achieve shallower junction and a three-dimensional structure for a next-generation transistor, the presence of the process window will be a significant constraint on such a doping technique.

Therefore, the present inventors have contemplated the following plasma doping technique based on the doping mechanism (i.e., ion-assisted doping) in which radicals play a primary role with the assistance of ion radiation, in order to (1) reduce or prevent erosion, resist hardening, etc. due to excessive ion flux, and/or (2) reduce or prevent a reduction in the adhesion ratio of a dopant due to excessive dissociation.

Specifically, the present disclosure describes implementations of a plasma doping method of using a plasma made of a gas (may be diluted with a dilution gas) containing an impurity which will serve as a dopant, in which (1) bias power supplied to a material to be doped and/or (2) plasma generation power are supplied in the form of pulses.

According to the present disclosure, in the doping mechanism (i.e., ion-assisted doping) in which radicals play a primary role with the assistance of ion irradiation, (1) excessive supply of ion flux can be reduced or prevented, and/or (2) excessive dissociation of a dopant can be reduced or prevented. Therefore, (1) erosion of a material to be doped and hardening of a resist can be reduced or prevented, and/or (2) a reduction in the adhesion ratio (and therefore the degree of doping and conformality) of a dopant (mainly radicals) can be reduced or prevented. As a result, the process window of selection of the conditions can be expanded in terms of (1) gas pressure and/or (2) gas residence time.

A first example plasma doping method of the present disclosure is provided for introducing an impurity into a substrate to be processed using a plasma doping apparatus including a chamber, a sample stage provided in the chamber and configured to hold the substrate to be processed, a gas supplier configured to supply a gas containing the impurity which will serve as a dopant into the chamber, a plasma generator configured to supply first high-frequency power to produce a plasma made of the gas, and a bias voltage applier configured to supply second high-frequency power to apply a bias voltage to the sample stage. The first high-frequency power is intermittently supplied, or high-level high-frequency power and low-level high-frequency power are alternately and repeatedly supplied as the first high-frequency power.

In the first example plasma doping method of the present disclosure, as the first high-frequency power (plasma generation high-frequency power) and the second high-frequency power (biasing high-frequency power), high-frequency power having a frequency of about 100 kHz to about 100 MHz, such as high-frequency power of 13.56 MHz having a commercial sine wave, can be used, although the present disclosure is not limited to this.

In the first example plasma doping method of the present disclosure, the first high-frequency power may have a modulation period which is longer than an ambipolar diffusion time of the plasma and is shorter than a gas residence time of the gas in the chamber. When the modulation period of the first high-frequency power is longer than the ambipolar diffusion time of the plasma, particularly, the modulation period of the first high-frequency power is such that the ambipolar diffusion time of the plasma is substantially negligible, the influence of the rise or fall time on the electron density or the ion density can be substantially eliminated. When the modulation period of the first high-frequency power is shorter than the gas residence time, the effect of reducing excessive dissociation of radicals can be ensured.

Note that the modulation period of the first high-frequency power which satisfies such conditions is substantially about 10 μsec or more and about 100 msec or less, taking into consideration the operation of existing plasma generation apparatuses.

In the first example plasma doping method of the present disclosure, the first high-frequency power may be pulse-modulated by high-level/low-level modulation in addition to on/off modulation. Moreover, various parameters of the first high-frequency power, such as a duty ratio etc., can be set to have wide ranges. Note that, in actual cases, the duty ratio of the first high-frequency power ("on time/modulation period" in the case of on/off modulation, and "high level time/modulation period" in the case of high-level/low-level modulation) is 0.1 or more and 0.9 or less.

In the first example plasma doping method of the present disclosure, the second high-frequency power may be intermittently supplied, or high-level high-frequency power and low-level high-frequency power may be alternately and repeatedly supplied as the second high-frequency power. Specifically, the second high-frequency power (biasing high-frequency power) may be supplied in the form of pulses. In this case, when the frequency of the first high-frequency power is larger than that of the second high-frequency power, particularly, when high-frequency power having a frequency slightly lower than that of the first high-frequency power (plasma generation high-frequency power) is used as the second high-frequency power (biasing high-frequency power), the conformality can be further improved. A phase difference may be set between modulation of the first high-frequency power and modulation of the second high-frequency power.

In the first example plasma doping method of the present disclosure, the gas may contain at least one of $BF_3$, $B_2H_6$, $B_{10}H_{14}$, $AsH_3$, $AsF_5$, $PH_3$, and $PF_3$.

In the first example plasma doping method of the present disclosure, the gas may contain a dilution gas. In this case, a gas having a small atomic weight, such as He, $H_2$, etc., may be used as the dilution gas in order to reduce or prevent erosion.

A second example plasma doping method of the present disclosure is provided for introducing an impurity into a substrate to be processed using a plasma doping apparatus including a chamber, a sample stage provided in the chamber and configured to hold the substrate to be processed, a gas supplier configured to supply a gas containing the impurity which will serve as a dopant into the chamber, a plasma generator configured to produce a plasma made of the gas, and a bias voltage applier configured to supply high-frequency power to apply a bias voltage to the sample stage. The high-frequency power is intermittently supplied, or high-level high-frequency power and low-level high-frequency power are alternately and repeatedly supplied as the high-frequency power.

In the second plasma doping method of the present disclosure, as the high-frequency power (biasing high-frequency power), high-frequency power having a frequency of about 100 kHz to about 100 MHz, such as high-frequency power of 13.56 MHz having a commercial sine wave, can be used, although the present disclosure is not limited to this.

In the second plasma doping method of the present disclosure, the plasma generator may be a high-frequency power supply or a DC pulsed power supply.

In the second plasma doping method of the present disclosure, the gas (i.e., a dopant gas) may contain at least one of $BF_3$, $B_2H_6$, $B_{10}H_{14}$, $AsH_3$, $AsF_5$, $PH_3$, and $PF_3$.

In the second plasma doping method of the present disclosure, the gas may contain a dilution gas. In this case, the dilution gas may be a gas having a small atomic weight, such as He, $H_2$, etc., in order to reduce or prevent erosion.

According to the present disclosure, doping in which radicals play a primary role with the assistance of ion irradiation can be performed, and excessive supply of ion flux and/or excessive dissociation of a dopant can be reduced or prevented in the doping. Therefore, erosion of the material to be doped and hardening of a resist can be reduced or prevented, and/or a reduction in the adhesion ratio of a dopant can be reduced or prevented, resulting in higher-concentration and more conformal doping.

In other words, the present disclosure relates to a plasma processing method using high-frequency discharge, and more particularly, to a method of plasma doping of a solid surface portion etc. with an impurity. With the method, higher-concentration and more conformal plasma doping can be achieved while reducing or preventing erosion of a material to be doped and hardening of a resist. Therefore, the present disclosure can provide shallower junction, a three-dimensional structure, etc. for scaling of a next-generation transistor.

DETAILED DESCRIPTION (First Embodiment)

A plasma doping method according to a first embodiment of the present disclosure will be described hereinafter with reference to the accompanying drawings.

Figure 1:
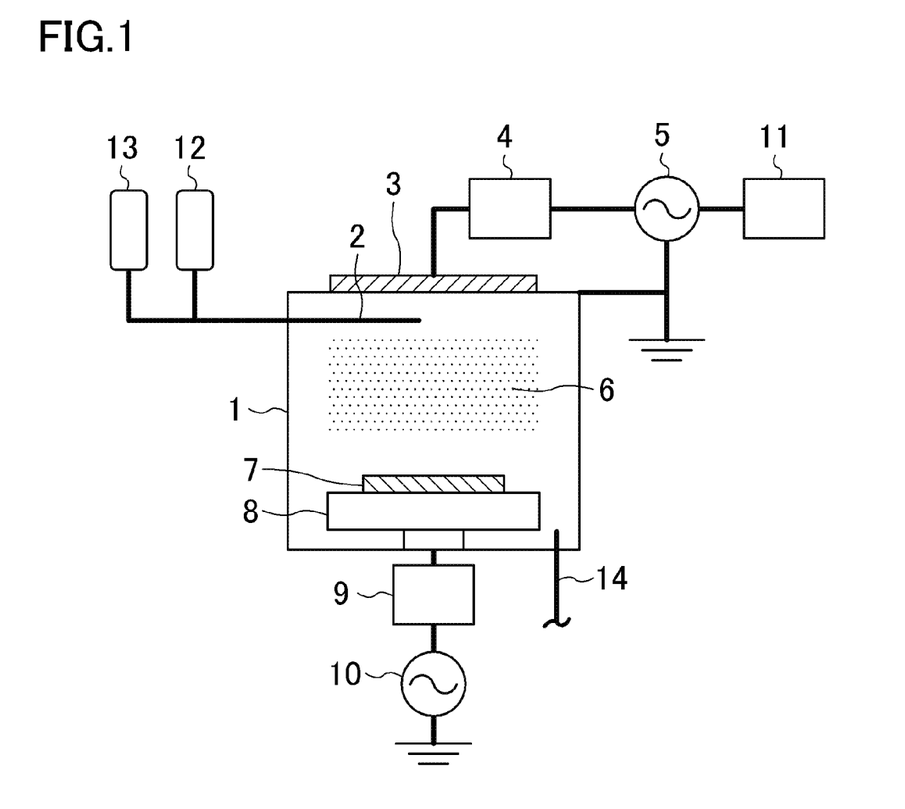
FIG. 1 is a diagram schematically showing a structure of a plasma processing apparatus used for a plasma doping method according to a first embodiment.

FIG. 1 is a diagram schematically showing a structure of a plasma processing apparatus used for the plasma doping method of this embodiment. As shown in FIG. 1, a gas introduction path 2 through which a gas containing an impurity which will serve as a dopant is supplied and a gas discharge path 14 are connected to the reaction chamber 1. A dopant gas supply apparatus 12 and a dilution gas supply apparatus 13 are connected to the gas introduction path 2. An upper electrode 3 is provided on a ceiling portion of the reaction chamber 1. A plasma generation high-frequency power supply 5 is connected via a matching circuit 4 to the upper electrode 3. A lower electrode (sample stage) 8 which holds a material to be doped 7, such as a substrate to be processed etc., is provided in the reaction chamber 1. A biasing high-frequency power supply 10 is connected via a matching circuit 9 to the lower electrode 8.

Moreover, in the plasma processing apparatus of FIG. 1, a pulse generator 11 is connected to the plasma generation high-frequency power supply 5.

In the plasma doping method of this embodiment employing the plasma processing apparatus of FIG. 1, initially, the dopant gas supply apparatus 12 and the dilution gas supply apparatus 13 supply a dopant gas (e.g., $AsH_3$ in the case of doping with an n-type impurity) and a dilution gas (e.g., He), respectively, via the gas introduction path 2 to the reaction chamber 1. Here, for example, the dopant gas diluted with the dilution gas (i.e., a gas mixture) contains, by volume, 0.05% $AsH_3$ and 99.95% He. Here, when high-frequency power for plasma generation is supplied from the plasma generation high-frequency power supply 5 via the matching circuit 4 to the upper electrode 3, a plasma 6 made of the gas mixture is produced. When high-frequency power for biasing is supplied from the biasing high-frequency power supply 10 via the matching circuit 9 to the lower electrode 8, i.e., the material to be doped 7, ions in the plasma 6 can be supplied to a surface of the material to be doped 7 with a predetermined level of energy corresponding to the level of the power.

In the plasma 6 thus produced, almost 100% of the dopant gas ($AsH_3$) is dissociated by collision of electrons, and therefore, most of the dopant gas is supplied in the form of radicals to the surface of the material to be doped 7. Therefore, most ions in the plasma 6 are dilution gas (He) ions.

In this embodiment, in order to efficiently carry out doping, it is important to supply a large number of dopant radicals and assist doping with appropriate ion irradiation. If the gas flow rate is decreased while the total gas pressure is kept at a predetermined level in order to achieve such doping, the dopant amount decreases, so that the sheet resistance of an impurity layer formed in the material to be doped 7 increases. This is considered to be a phenomenon caused by the radicals. Specifically, it is considered that as the gas flow rate is reduced to increase the gas residence time, the dissociation reaction of the dopant gas excessively proceeds to a proportionate extent, so that a large number of lower-molecular weight radicals (i.e., radicals which are less adsorbed by the material to be doped 7) are produced, and therefore, the adhesion ratio of the dopant decreases.

The gas residence time may be reduced by increasing the gas discharge rate, but there is the equipment limit. Therefore, as the total gas pressure increases, the lower limit (minimum value) of the possible gas residence time increases. Specifically, even when the total gas pressure is set to be high in order to supply ions and radicals with high efficiency, then if the gas residence time increases, the adhesion ratio of the dopant or the number of adhesive dopant radicals is likely to relatively decrease.

Therefore, in this embodiment, in order to control an increase or a decrease in the number of adhesive dopant radicals with respect to the ion flux rate without changing the gas pressure and the gas residence time, the pulse generator 11 is used to apply a pulse modulation control to plasma generation power which is supplied from the plasma generation high-frequency power supply 5.

Figure 2:
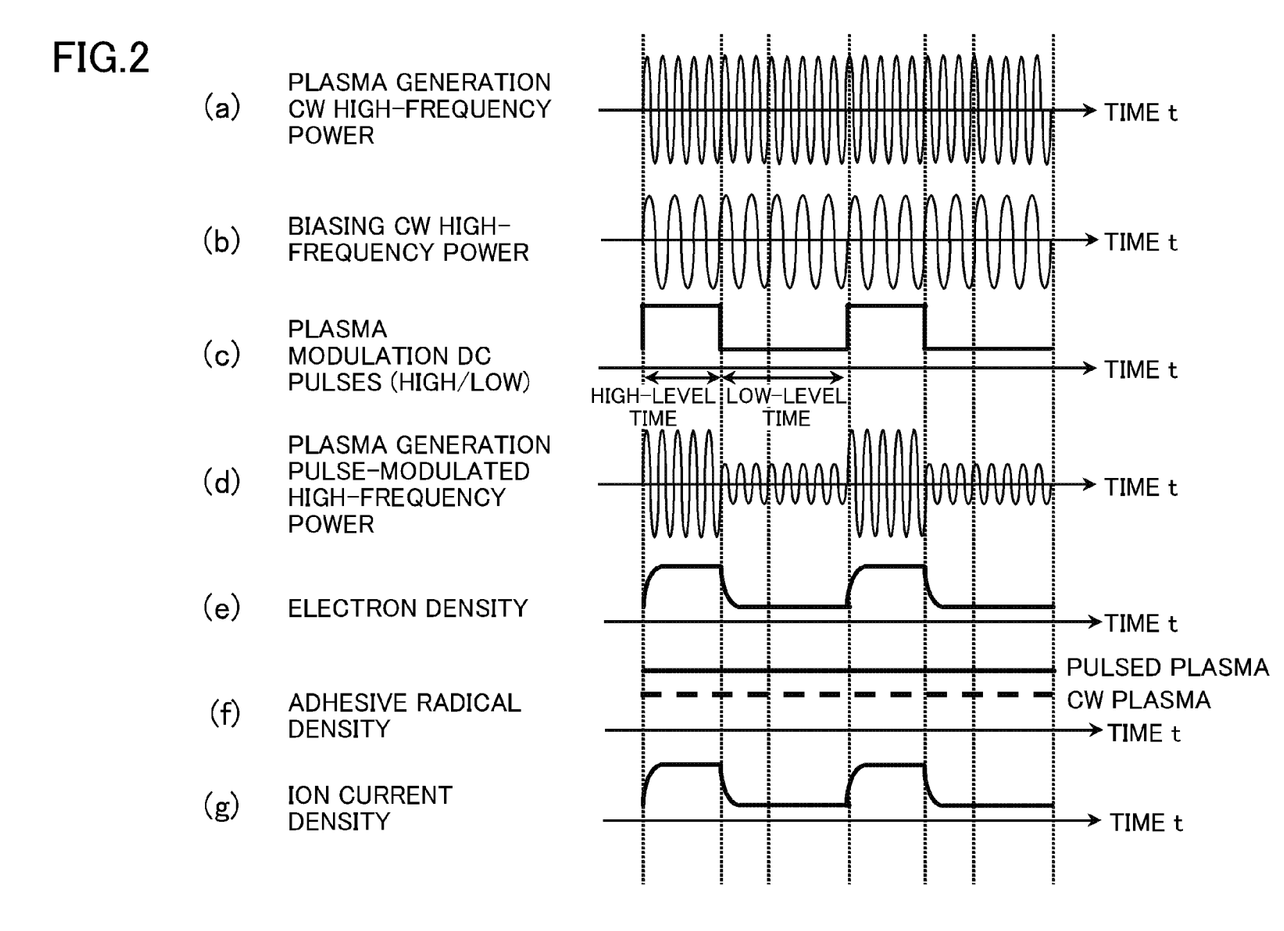
FIG. 2 is a diagram for describing pulse modulation of plasma generation high-frequency power in the plasma doping method of the first embodiment.

Portions (a) and (b) of FIG. 2 show example waveforms (continuous waves (CW)) of the plasma generation high-frequency power and the biasing high-frequency power supplied from the plasma generation high-frequency power supply 5 and the biasing high-frequency power supply 10, respectively.

In this embodiment, for example, by sending direct current (DC) pulses having a waveform shown in (c) of FIG. 2 from the pulse generator 11 to the plasma generation high-frequency power supply 5, the plasma generation high-frequency power is pulse-modulated as shown in (d) of FIG. 2. In this case, for example, changes over time in the electron density and the ion current density are basically associated with changes over time in the plasma generation high-frequency power as shown in (e) and (g) of FIG. 2. The electron density and the ion current density have a rise time component and a fall time component of the order of microseconds (μsec) relating to an ambipolar diffusion time.

On the other hand, the number of adhesive dopant radicals (i.e., an adhesive radical density) supplied to the material to be doped has a life of the order of milliseconds (msec) where the gas residence time is substantially the upper limit, and therefore, is constant over time as shown in (f) of FIG. 2, for example.

Note that an effective dissociation reaction time in the case where the plasma generation high-frequency power is pulse-modulated, e.g., on/off modulation, is considered to be determined by [gas residence time]×[duty ratio], and therefore, is shorter than that in the case where the plasma generation high-frequency power is not pulse-modulated (continuous wave (CW)). Therefore, the number of adhesive dopant radicals in the case where the plasma generation high-frequency power is pulse-modulated is larger than that in the case where the plasma generation high-frequency power is not pulse-modulated (CW) (see (f) of FIG. 2). On the other hand, the ion current density (i.e., the ion flux rate) in the case where the plasma generation high-frequency power is pulse-modulated, e.g., on/off modulation, is lower by an amount corresponding to the duty ratio than that in the case where the plasma generation high-frequency power is not pulse-modulated (CW). Therefore, the number of adhesive dopant radicals can be relatively increased with respect to the ion flux rate.

As described above, according to the first embodiment, even when the total gas pressure is increased, but the gas residence time cannot be reduced due to the equipment limit of the evacuation speed, the following advantage can be obtained by applying a pulse modulation control to the plasma generation high-frequency power. Specifically, by reducing the ion flux rate, erosion of the material to be doped or hardening of a resist can be reduced or prevented. Moreover, excessive dissociation of dopant radicals can be reduced to increase the number of adhesive dopant radicals. In other words, it is possible to reduce or prevent a reduction in the adhesion ratio of dopant radicals, and therefore, reduce or prevent a reduction in the dopant amount and the conformality.

Figure 3:
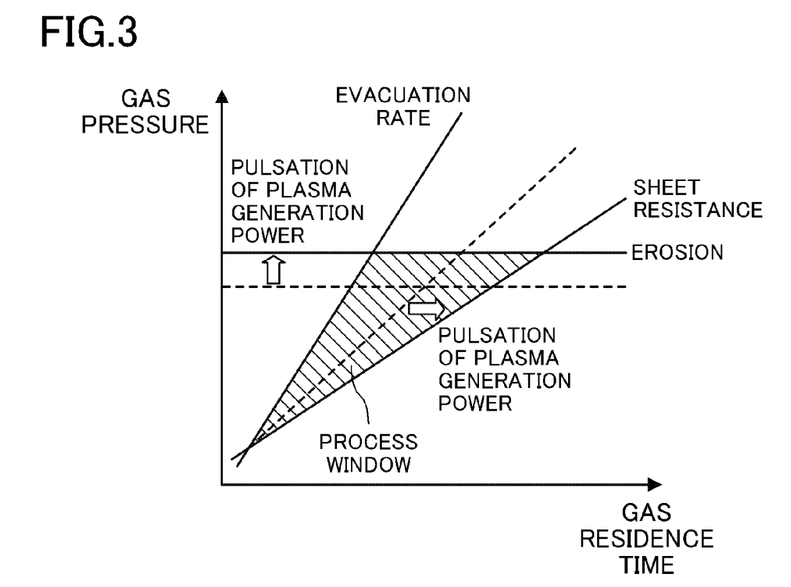
FIG. 3 is a diagram showing a process window in the plasma doping method of the first embodiment.

Therefore, according to the first embodiment, it is possible to perform highly efficient doping in which radicals play a primary role with the assistance of appropriately reduced ion irradiation. Moreover, as shown in FIG. 3, a process window for selection of conditions can be expanded in terms of gas pressure and/or gas residence time, compared to conventional process windows as shown in FIG. 9.

In the first embodiment, high-level/low-level modulation is employed as pulse modulation as shown in (c) of FIG. 2. Instead of this, on/off modulation may be employed.

In the first embodiment, the modulation period of the plasma generation high-frequency power (e.g., [high-level time]+[low-level time] in the case of the waveform of (d) of FIG. 2) is preferably longer than the ambipolar diffusion time of the plasma and shorter than the gas residence time in the chamber. When the modulation period of the plasma generation high-frequency power is longer than the ambipolar diffusion time of the plasma, particularly, when the modulation period of the plasma generation high-frequency power is such that the ambipolar diffusion time of the plasma is substantially negligible, the influence of the rise or fall time on the electron density or the ion density can be substantially eliminated. When the modulation period of the plasma generation high-frequency power is shorter than the gas residence time, the effect of reducing the excessive dissociation of radicals can be ensured. Note that the modulation period of the plasma generation high-frequency power which satisfies such conditions is substantially about 10 μsec or more and about 100 msec or less, taking into consideration the operation of existing plasma generation apparatuses.

For example, the gas residence time is calculated by $$\tau_r = V/((F/P) \times (101,325/60)) = 0.060 \text{ sec } (60 \text{ msec})$$

$\tau_r$: gas residence time
F: gas flow rate
P: gas pressure
V: chamber volume
where F is 500 cm$^3$/min (standard state) (note that 1 atm=101,325 Pa), P is 0.5 Pa, and V is 101,325 cm$^3$.

When the dilution gas is He, the ambipolar diffusion time is calculated by $$\tau_s = (L^2/\pi^2) \times (P/DaP) = (10^2/\pi^2) \times (0.5/(560 \times 133.322)) = 0.000068 \text{ sec } (68 \text{ μsec})$$

$\tau_s$: ambipolar diffusion time
DaP: ambipolar diffusion coefficient of He
L: distance between electrodes
P: gas pressure
where DaP is 560 (cm$^2$/sec) Torr (note that 1 Torr=133.322 Pa), L is 10 cm, and P is 0.5 Pa.

In the first embodiment, various parameters of the plasma generation high-frequency power, such as a duty ratio etc., can be set to have wide ranges. Note that, in actual cases, the duty ratio of the plasma generation high-frequency power ("on time/modulation period" in the case of on/off modulation, and "high-level time/modulation period" in the case of high-level/low-level modulation) is 0.1 or more and 0.9 or less.

Although AsH$_3$ is used as the dopant gas in the first embodiment, the present disclosure is not limited to this. At least one of BF$_3$, B$_2$H$_6$, B$_{10}$H$_{14}$, AsH$_3$, AsF$_5$, PH$_3$, PF$_3$, etc. may be used.

Although He is used as the dilution gas in the first embodiment, other gases may be used instead of this. Note that a gas having a small atomic weight, such as He, $H_2$, etc., may be used as the dilution gas in order to reduce or prevent erosion.

Although the plasma processing apparatus of FIG. 1 is used in the first embodiment, the present disclosure is not limited to this. Any plasma processing apparatus may be used that includes, at least, a chamber, a sample stage which is provided in the chamber and holds a material to be doped, a gas supplier which supplies a gas containing an impurity which will serve as a dopant into the chamber, a plasma generator which supplies plasma generation high-frequency power to produce a plasma made of the gas, and a bias voltage applier which supplies biasing high-frequency power to apply a bias voltage to the sample stage.

(Second Embodiment)

A plasma doping method according to a second embodiment of the present disclosure will be described hereinafter with reference to the drawings.

Figure 4:
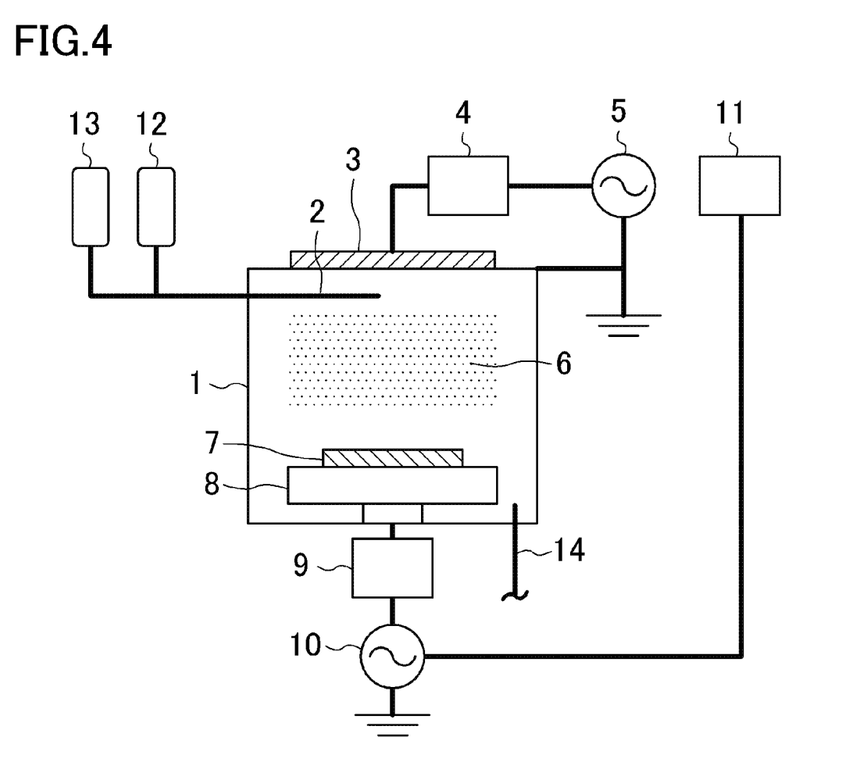
FIG. 4 is a diagram schematically showing a structure of a plasma processing apparatus used for a plasma doping method according to a second embodiment.

FIG. 4 is a diagram schematically showing a structure of a plasma processing apparatus used for the plasma doping method of this embodiment. As shown in FIG. 4, a gas introduction path 2 through which a gas containing an impurity which will serve as a dopant is supplied and a gas discharge path 14 are connected to the reaction chamber 1. A dopant gas supply apparatus 12 and a dilution gas supply apparatus 13 are connected to the gas introduction path 2. An upper electrode 3 is provided on a ceiling portion of the reaction chamber 1. A plasma generation high-frequency power supply 5 is connected via a matching circuit 4 to the upper electrode 3. A lower electrode (sample stage) 8 which holds a material to be doped 7, such as a substrate to be processed etc., is provided in the reaction chamber 1. A biasing high-frequency power supply 10 is connected via a matching circuit 9 to the lower electrode 8.

Moreover, in the plasma processing apparatus of FIG. 4, a pulse generator 11 is connected to the biasing high-frequency power supply 10.

In the plasma doping method of this embodiment employing the plasma processing apparatus of FIG. 4, initially, the dopant gas supply apparatus 12 and the dilution gas supply apparatus 13 supply a dopant gas (e.g., $B_2H_6$ in the case of doping with a p-type impurity) and a dilution gas (e.g., He), respectively, via the gas introduction path 2 to the reaction chamber 1. Here, for example, the dopant gas diluted with the dilution gas (i.e., a gas mixture) contains, by volume, 0.04% $B_2H_6$ and 99.96% He. Here, when high-frequency power for plasma generation is supplied from the plasma generation high-frequency power supply 5 via the matching circuit 4 to the upper electrode 3, a plasma 6 made of the gas mixture is produced. When high-frequency power for biasing is supplied from the biasing high-frequency power supply 10 via the matching circuit 9 to the lower electrode 8, i.e., the material to be doped 7, ions in the plasma 6 can be supplied to a surface of the material to be doped 7 with a predetermined level of energy corresponding to the level of the power.

In the plasma 6 thus produced, almost 100% of the dopant gas ($B_2H_6$) is dissociated by collision of electrons, and therefore, most of the dopant gas is supplied in the form of radicals to the surface of the material to be doped 7. Therefore, most ions in the plasma 6 are dilution gas (He) ions.

In this embodiment, in order to efficiently carry out doping, it is necessary to supply a large number of dopant radicals and assist doping with appropriate ion irradiation. A simple way to increase the number of dopant radicals may be to increase the total gas pressure. In this case, the electron density and the gas residence time increase, so that the electron impact dissociation may excessively proceed, and therefore, low-molecular weight radicals having a low adhesion ratio may be more likely to be produced. As a result, compared to the ion flux rate which monotonically increases, the number of adhesive dopant radicals relatively decreases, and therefore, the doping efficiency effectively decreases. If the ion flux rate is relatively excessive, the erosion of the material to be doped, the hardening of the resist, etc. adversely occur.

Therefore, in this embodiment, in order to control the ion flux rate independently of the number of adhesive dopant radicals, the pulse generator 11 is used to apply a pulse modulation control to the biasing high-frequency power supplied from the biasing high-frequency power supply 10.

Figure 5:
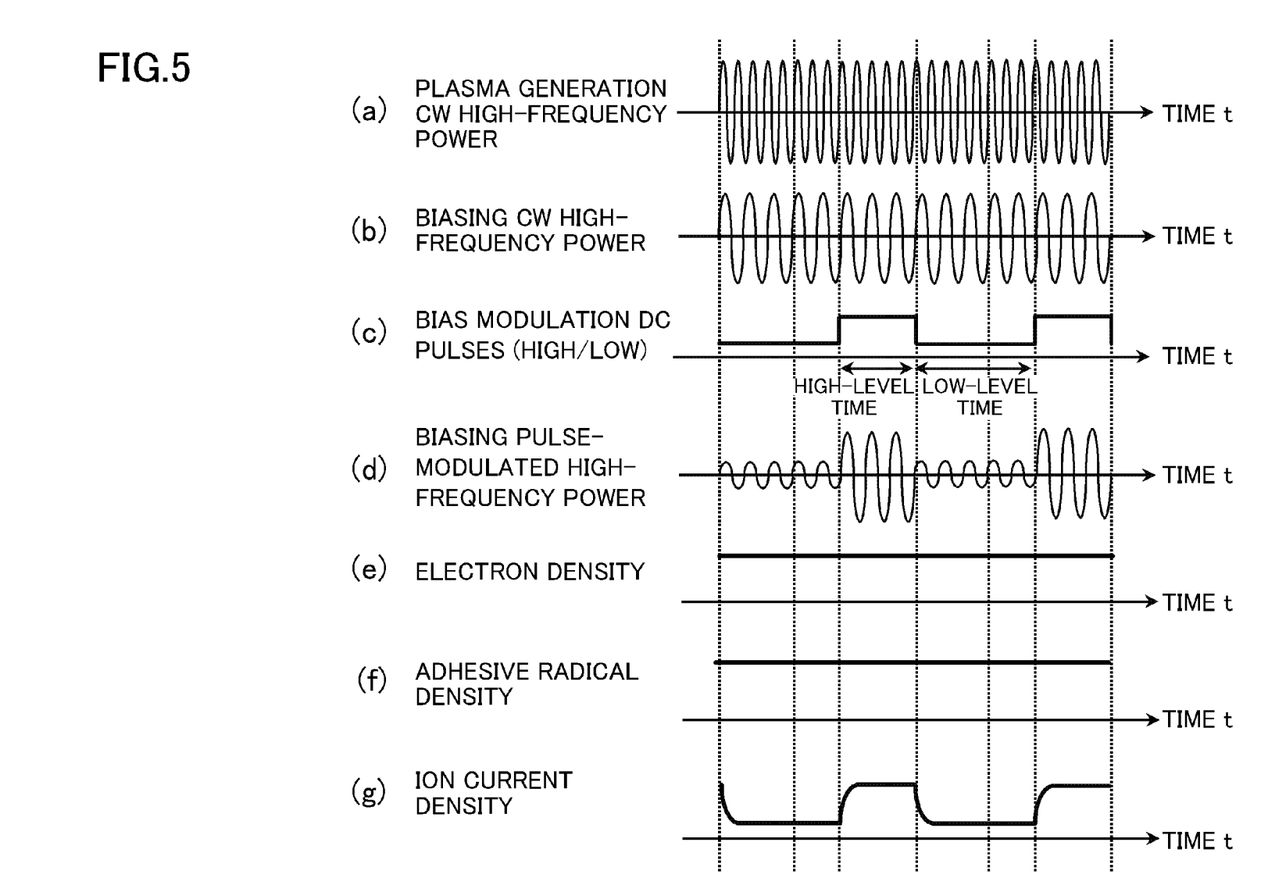
FIG. 5 is a diagram for describing pulse modulation of plasma generation high-frequency power in the plasma doping method of the second embodiment.

Portions (a) and (b) of FIG. 5 show example waveforms (continuous waves (CW)) of the plasma generation high-frequency power and the biasing high-frequency power supplied from the plasma generation high-frequency power supply 5 and the biasing high-frequency power supply 10, respectively.

In this embodiment, for example, by sending direct current (DC) pulses having a waveform shown in (c) of FIG. 5 from the pulse generator 11 to the biasing high-frequency power supply 10, the biasing high-frequency power is pulse-modulated as shown in (d) of FIG. 5. In this case, for example, changes over time in the electron density and the number of adhesive dopant radicals (i.e., an adhesive radical density) are basically associated with the plasma generation high-frequency power (continuous wave (CW)) as shown in (e) and (f) of FIG. 5, and therefore, are similar to those observed when the biasing high-frequency power is not pulse-modulated (CW).

On the other hand, the rate of ion flux supplied to the material to be doped, i.e., an ion current density shown in (g) of FIG. 5 and ion energy, can be reduced by setting the duty ratio and/or the power amplitude ratio (the magnification of the power amplitude by pulse modulation) of the pulse-modulated biasing high-frequency power.

As described above, according to the second embodiment, for example, even if the influence of the ion flux is excessive due to an increase in the total gas pressure, the following advantage can be obtained by applying a pulse modulation control to the biasing high-frequency power. Specifically, the ion flux rate is reduced by applying a pulse modulation control to the biasing high-frequency power, whereby the erosion of the material to be doped and the hardening of the resist can be reduced or prevented. Therefore, it is possible to perform highly efficient doping in which radicals play a primary role with the assistance of appropriately reduced ion irradiation. Moreover, the process window for the selection of the conditions can be expanded in terms of at least gas pressure.

In the second embodiment, high-level/low-level modulation is employed as pulse modulation as shown in (c) of FIG. 5. Instead of this, on/off modulation may be employed.

In the second embodiment, various parameters of the biasing high-frequency power, such as a duty ratio, a power amplitude ratio, etc., can be set to have wide ranges, depending on how much the rate of ion flux supplied to the material to be doped is reduced.

Although $B_2H_6$ is used as the dopant gas in the second embodiment, the present disclosure is not limited to this. At least one of $BF_3$, $B_2H_6$, $B_{10}H_{14}$, $AsH_3$, $AsF_5$, $PH_3$, $PF_3$, etc. may be used.

Although He is used as the dilution gas in the second embodiment, other gases may be used instead of this. Note that a gas having a small atomic weight, such as He, $H_2$, etc., may be used as the dilution gas in order to reduce or prevent erosion.

Although the plasma processing apparatus of FIG. 4 is used in the second embodiment, the present disclosure is not limited to this. Any plasma processing apparatus may be used that includes, at least, a chamber, a sample stage which is provided in the chamber and holds a material to be doped, a gas supplier which supplies a gas containing an impurity which will serve as a dopant into the chamber, a plasma generator which produces a plasma made of the gas, and a bias voltage applier which supplies biasing high-frequency power to apply a bias voltage to the sample stage. Although the plasma generation high-frequency power supply 5 is used as the plasma generator in this embodiment, other plasma sources, such as a DC pulsed power supply etc., may be used instead of this.

(Variation of First or Second Embodiment)

A plasma doping method according to a variation of the first or second embodiment of the present disclosure will be described hereinafter with reference to the drawings. In the first embodiment, the plasma generation high-frequency power is supplied in the form of pulses, and in the second embodiment, the biasing high-frequency power is supplied in the form of pulses. Alternatively, in this variation, the plasma generation high-frequency power and the biasing high-frequency power are both supplied in the form of pulses.

Figure 6:
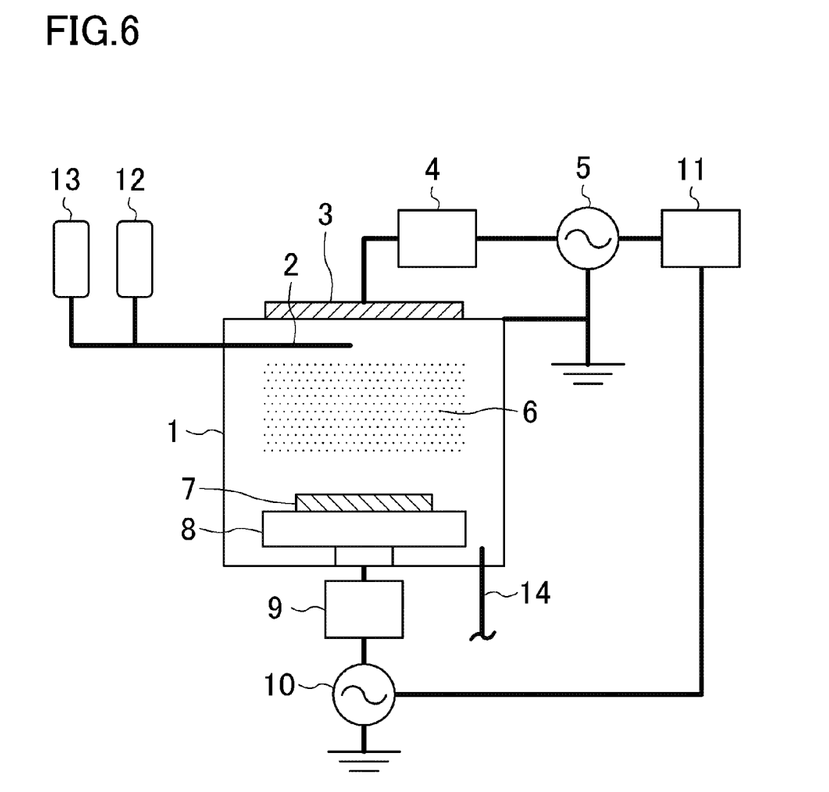
FIG. 6 is a diagram schematically showing a structure of a plasma processing apparatus used for a plasma doping method according to a variation of the first or second embodiment.

FIG. 6 is a diagram schematically showing a structure of a plasma processing apparatus used for the plasma doping method of this variation. In FIG. 6, the same components as those of the plasma processing apparatus used in the first embodiment of FIG. 1 or the second embodiment of FIG. 4 are indicated by the same reference characters.

As shown in FIG. 6, in the plasma processing apparatus of this variation, the pulse generator 11 is connected to both of the plasma generation high-frequency power supply 5 and the biasing high-frequency power supply 10. Here, different pulse generators may be connected to the plasma generation high-frequency power supply 5 and the biasing high-frequency power supply 10 separately.

In this variation, the pulse generator 11 is used to apply a pulse modulation control to the plasma generation power supplied from the plasma generation high-frequency power supply 5, and the pulse generator 11 is also used to apply a pulse modulation control to the biasing high-frequency power supplied from the biasing high-frequency power supply 10.

Figure 7:
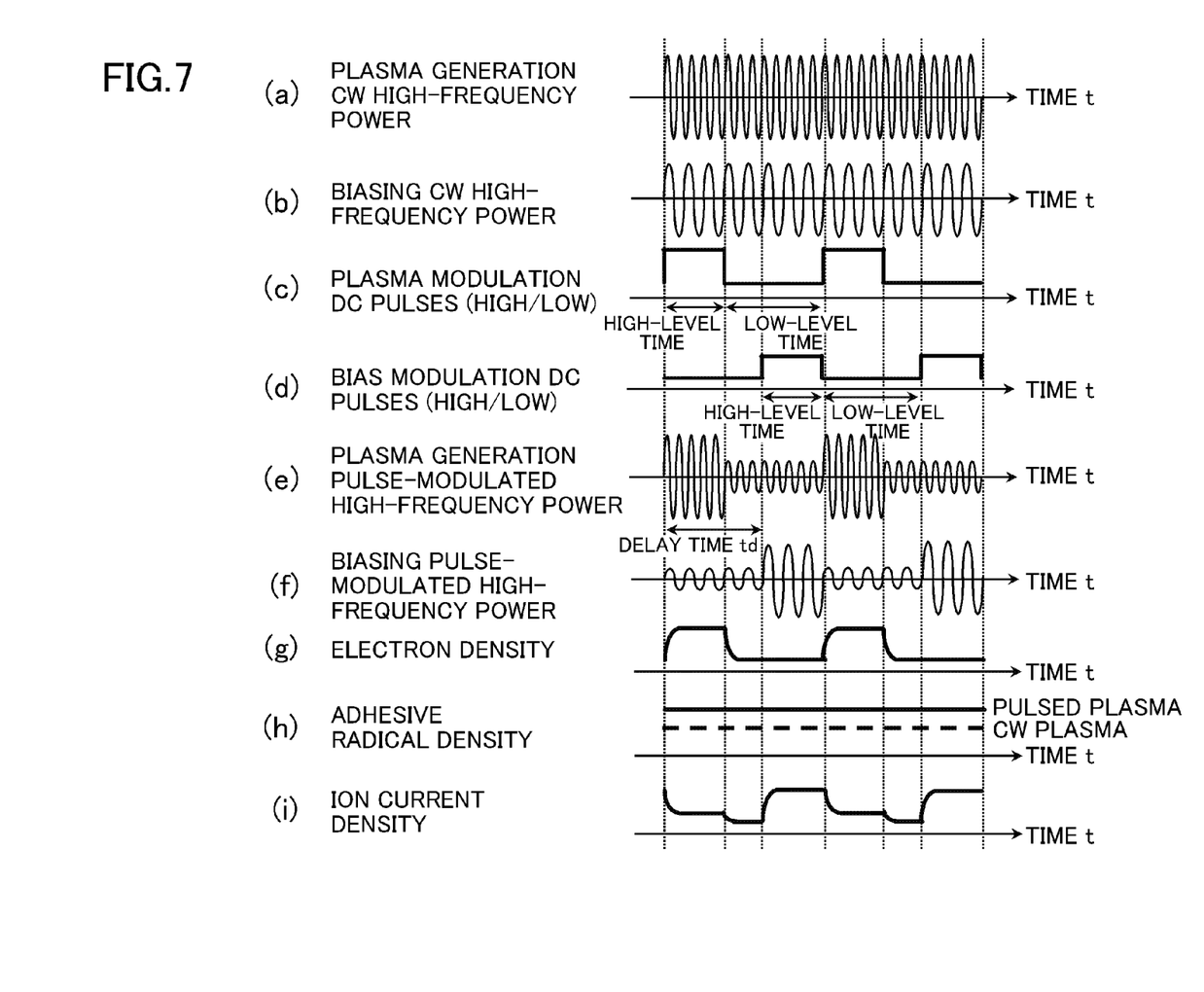
FIG. 7 is a diagram for describing pulse modulation of plasma generation high-frequency power and biasing high-frequency power in the plasma doping method of the variation of the first or second embodiment.

Portions (a) and (b) of FIG. 7 show example waveforms (continuous waves (CW)) of the plasma generation high-frequency power and the biasing high-frequency power supplied from the plasma generation high-frequency power supply 5 and the biasing high-frequency power supply 10, respectively.

In this variation, for example, by sending direct current (DC) pulses having a waveform shown in (c) of FIG. 7 from the pulse generator 11 to the plasma generation high-frequency power supply 5, the plasma generation high-frequency power is pulse-modulated as shown in (e) of FIG. 7. In this case, for example, changes over time in the electron density and the ion current density are basically associated with changes over time in the plasma generation high-frequency power as shown in (g) and (i) of FIG. 7. The electron density and the ion current density have a rise time component and a fall time component of the order of microseconds (μsec) relating to an ambipolar diffusion time. On the other hand, the number of adhesive dopant radicals (i.e., an adhesive radical density) supplied to the material to be doped has a life of the order of milliseconds (msec) where the gas residence time is substantially the upper limit, and therefore, is constant over time as shown in (h) of FIG. 7, for example.

Note that an effective dissociation reaction time in the case where the plasma generation high-frequency power is pulse-modulated, e.g., on/off modulation, is considered to be determined by [gas residence time]×[duty ratio], and therefore, is shorter than that in the case where the plasma generation high-frequency power is not pulse-modulated (continuous wave (CW)). Therefore, the number of adhesive dopant radicals in the case where the plasma generation high-frequency power is pulse-modulated is larger than that in the case where the plasma generation high-frequency power is not pulse-modulated (CW) (see (h) of FIG. 7). On the other hand, the ion current density (i.e., the ion flux rate) in the case where the plasma generation high-frequency power is pulse-modulated, e.g., on/off modulation, is lower by an amount corresponding to the duty ratio than that in the case where the plasma generation high-frequency power is not pulse-modulated (CW). Therefore, the number of adhesive dopant radicals can be relatively increased with respect to the ion flux rate.

Also, in this variation, for example, by sending direct current (DC) pulses having a waveform shown in (d) of FIG. 7 from the pulse generator 11 to the biasing high-frequency power supply 10, the biasing high-frequency power is pulse-modulated as shown in (f) of FIG. 7. In this case, the rate of ion flux supplied to the material to be doped, i.e., an ion current density shown in (i) of FIG. 7 and ion energy, can be reduced by setting the duty ratio and/or the power amplitude ratio of the pulse-modulated biasing high-frequency power.

As described above, according to this variation, the advantages of the first and second embodiments can be simultaneously obtained. Specifically, the ion flux rate can be reduced, thereby reducing or preventing the erosion of the material to be doped and the hardening of the resist. Moreover, the excessive dissociation of dopant radicals can be reduced, thereby increasing the number of adhesive dopant radicals. In other words, it is possible to reduce or prevent a reduction in the adhesion ratio of dopant radicals, and therefore, reduce or prevent a reduction in the dopant amount and the conformality.

Therefore, according to this variation, it is possible to perform highly efficient doping in which radicals play a primary role with the assistance of appropriately reduced ion irradiation. Moreover, the process window for the selection of the conditions can be expanded in terms of gas pressure and/or gas residence time.

Also, according to this variation, for example, as shown in (e) and (f) of FIG. 7, a phase difference (i.e., a delay time) may be set between pulse modulation of the plasma generation high-frequency power and pulse modulation of the biasing high-frequency power. In this case, for example, as shown in (i) of FIG. 7, the ion energy or the ion flux rate can be controlled based on the phase difference while the number of adhesive dopant radicals is kept constant over time.

Moreover, according to this variation, when the frequency of the plasma generation high-frequency power is set to be higher than that of the biasing high-frequency power, particularly, when the biasing high-frequency power is set to have a frequency slightly lower than that of the plasma generation high-frequency power, the conformality can be further improved.

Note that, in this variation, high-level/low-level modulation is employed as pulse modulation of the plasma generation high-frequency power as shown in (c) of FIG. 7. Instead of this, on/off modulation may be employed.

Note that, in this variation, high-level/low-level modulation is employed as pulse modulation of the biasing high-frequency power as shown in (d) of FIG. 7. Instead of this, on/off modulation may be employed.

In this variation, the modulation period of the plasma generation high-frequency power (e.g., [high-level time]+[low-level time] in the case of the pulse modulation of (c) of FIG. 7) is preferably longer than the ambipolar diffusion time of the plasma and shorter than the gas residence time in the chamber. When the modulation period of the plasma generation high-frequency power is longer than the ambipolar diffusion time of the plasma, particularly, when the modulation period of the plasma generation high-frequency power is such that the ambipolar diffusion time of the plasma is substantially negligible, the influence of the rise or fall time on the electron density or the ion density can be substantially eliminated. When the modulation period of the plasma generation high-frequency power is shorter than the gas residence time, the effect of reducing excessive dissociation of radicals can be ensured. Note that the modulation period of the plasma generation high-frequency power which satisfies such conditions is substantially about 10 μsec or more and about 100 msec or less, taking into consideration the operation of existing plasma generation apparatuses.

Also, in this variation, various parameters of the plasma generation high-frequency power, such as a duty ratio etc., can be set to have wide ranges. Note that, in actual cases, the duty ratio of the plasma generation high-frequency power ("on time/modulation period" in the case of on/off modulation, and "high level time/modulation period" in the case of high-level/low-level modulation) is 0.1 or more and 0.9 or less.

Also, in this variation, various parameters of the biasing high-frequency power, such as a duty ratio, a power amplitude ratio, etc., can be set to have wide ranges, depending on a reduction in the rate of ion flux supplied to the material to be doped.

In this variation, at least one of $BF_3$, $B_2H_6$, $B_{10}H_{14}$, $AsH_3$, $AsF_5$, $PH_3$, $PF_3$, etc. may be used as the dopant gas.

In this variation, although the type of the dilution gas is not particularly limited, a gas having a small atomic weight, such as He, $H_2$, etc., may be used in order to reduce or prevent erosion.

Although the plasma processing apparatus of FIG. 6 is used in this variation, the present disclosure is not limited to this. Any plasma processing apparatus may be used that includes, at least, a chamber, a sample stage which is provided in the chamber and holds a material to be doped, a gas supplier which supplies a gas containing an impurity which will serve as a dopant into the chamber, a plasma generator which supplies plasma generation high-frequency power to produce a plasma made of the gas, and a bias voltage applier which supplies biasing high-frequency power to apply a bias voltage to the sample stage.

What is claimed is:

1. A plasma doping method for introducing an impurity into a substrate to be processed using a plasma doping apparatus including a chamber, a sample stage provided in the chamber and configured to hold the substrate to be processed, a gas supplier configured to supply a gas containing the impurity which will serve as a dopant into the chamber, a plasma generator configured to supply first high-frequency power to produce a plasma made of the gas, and a bias voltage applier configured to supply second high-frequency power to apply a bias voltage to the sample stage, wherein
   the first high-frequency power is intermittently supplied, and
   the first high-frequency power has a modulation period which is longer than an ambipolar diffusion time of the plasma and is shorter than a gas residence time of the gas in the chamber.

2. The plasma doping method of claim 1, wherein the modulation period of the first high-frequency power is 10 μsec or more and 100 msec or less.

3. The plasma doping method of claim 1, wherein the first high-frequency power has a duty ratio of 0.1 or more and 0.9 or less.

4. The plasma doping method of claim 1, wherein the second high-frequency power is intermittently supplied, or high-level high-frequency power and low-level high-frequency power are alternately and repeatedly supplied as the second high-frequency power.

5. The plasma doping method of claim 4, wherein the first high-frequency power has a frequency higher than that of the second high-frequency power.

6. The plasma doping method of claim 4, wherein a phase difference is set between modulation of the first high-frequency power and modulation of the second high-frequency power.

7. The plasma doping method of claim 1, wherein the gas contains at least one of $BF_3$, $B_2H_6$, $B_{10}H_{14}$, $AsH_3$, $AsF_5$, $PH_3$, and $PF_3$.

8. The plasma doping method of claim 1, wherein the gas contains a dilution gas.

9. The plasma doping method of claim 8, wherein the dilution gas is He.

10. A plasma doping method for introducing an impurity into a substrate to be processed using a plasma doping apparatus including a chamber, a sample stage provided in the chamber and configured to hold the substrate to be processed, a gas supplier configured to supply a gas containing the impurity which will serve as a dopant into the chamber, a plasma generator configured to produce a plasma made of the gas, and a bias voltage applier configured to supply high-frequency power to apply a bias voltage to the sample stage, wherein
   high-level high-frequency power and low-level high-frequency power are alternately and repeatedly supplied as the high-frequency power.

11. The plasma doping method of claim 10, wherein the plasma generator is a high-frequency power supply or a DC pulsed power supply.

12. The plasma doping method of claim 10, wherein the gas contains at least one of $BF_3$, $B_2H_6$, $B_{10}H_{14}$, $AsH_3$, $AsF_5$, $PH_3$, and $PF_3$.

13. The plasma doping method of claim 10, wherein the gas contains a dilution gas.

14. The plasma doping method of claim 13, wherein the dilution gas is He.

15. A plasma doping method for introducing an impurity into a substrate to be processed using a plasma doping apparatus including a chamber, a sample stage provided in the chamber and configured to hold the substrate to be processed, a gas supplier configured to supply a gas containing the impurity which will serve as a dopant into the chamber, a plasma generator configured to supply first high-frequency power to produce a plasma made of the gas, and a bias voltage applier configured to supply second high-frequency power to apply a bias voltage to the sample stage, wherein
   high-level high-frequency power and low-level high-frequency power are alternately and repeatedly supplied as the first high-frequency power.

16. The plasma doping method of claim 15, wherein the second high-frequency power is intermittently supplied.

17. The plasma doping method of claim 15, wherein high-level high-frequency power and low-level high-frequency power are alternately and repeatedly supplied as the second high-frequency power.

18. The plasma doping method of claim 15, wherein the gas contains at least one of $BF_3$, $B_2H_6$, $B_{10}H_{14}$, $AsH_3$, $AsF_5$, $PH_3$, and $PF_3$.

19. The plasma doping method of claim 15, wherein the gas contains a dilution gas.

20. The plasma doping method of claim 19, wherein the dilution gas is He.

\* \* \* \* \*